United States Patent [19]

Pedersen

[11] 3,860,836

[45] Jan. 14, 1975

[54] STABILIZATION OF EMITTER FOLLOWERS

[75] Inventor: Richard A. Pedersen, Allentown, Pa.

[73] Assignee: Honeywell Inc., Minneapolis, Minn.

[22] Filed: Dec. 1, 1972

[21] Appl. No.: 311,050

[52] U.S. Cl. .................. 307/303, 307/203, 307/213, 330/32, 330/38 M, 357/48, 357/51, 357/54

[51] Int. Cl. ............................................ H01l 19/00

[58] Field of Search ......... 330/21, 27, 18, 32, 38 M; 307/203, 207, 213, 303

[56] References Cited

UNITED STATES PATENTS

| | | | |
|---|---|---|---|
| 3,223,938 | 12/1965 | Brook | 330/27 |
| 3,423,650 | 1/1969 | Cohen | 317/235 |
| 3,570,114 | 3/1971 | Bean et al. | 317/235 |

OTHER PUBLICATIONS

MECL System Design Handbook (Motorola, Inc., Scottsdale, Ariz.), Dec. 1972, pgs. 2 and 100.

RCA Linear Integrated Circuits (RCA, Somerville, N.J., 8/1970), pgs. 45, 266, and 267.

Hunter, Handbook of Semiconductor Electronics, 2nd Ed., McGraw-Hill, 1962, pgs. 15-22, 15-23.

*Primary Examiner*—Stanley D. Miller, Jr.
*Assistant Examiner*—William D. Larkins
*Attorney, Agent, or Firm*—Theodore F. Neils

[57] ABSTRACT

A circuit and a device construction for stabilizing rapidly responsive emitter follower circuits particularly for use in rapid systems.

12 Claims, 2 Drawing Figures

PATENTED JAN 14 1975 3,860,836

STABILIZATION OF EMITTER FOLLOWERS

BACKGROUND OF THE INVENTION

This invention relates to emitter follower circuits for responding to signals having high frequency components which are to be constructed as integrated circuit devices.

The commonly used emitter follower circuit is well known to be potentially unstable when its output is capacitively loaded. Uncompensated operation in such a situation may result in the circuit oscillating in some conditions when the transistor therein is operated in its active region as an amplifier or caused to pass through its active region when used in a switching application. The existence of potential instability in the emitter follower cirrcuit follows from the input circuit impedance having a real part which becomes negative as a function of frequency at some frequency values as a result of the capacitive loading. The result is that some choices of source impedance, when used to drive the emitter follower circuit, will lead to circuit instability and hence oscillation. A source appearing to be inductive is such a source impedance as will cause instability for some inductive values. With the input leads to an emitter follower circuit always having some inductance and with the output always being somewhat capacitively loaded, some corrective measures are often required to prevent oscillation.

Several corrective measures have been used in the past to prevent instability in emitter follower circuits. Among them are the placing of a relatively large resistance in series with the base of the emitter follower transistor, the use of capacitive feedback from the collector to the base and the placing of a wound ferrite core in series with the transistor emitter. These solutions are not very satisfactory when used with integrated circuit emitter followers intended for high frequency operation. Such solutions reduce the signal level, reduce the speed of operation possible and/or are not particularly suitable for integration. Yet corrective measures are often required for the proper operation of a rapidly responsive integrated emitter follower circuit. This is particularly the case where emitter follower circuits are used as input circuits in an integrated device so that input leads to such emitter followers brought from other devices have an appreciable length with a resulting lead inductance of a significant value.

SUMMARY OF THE INVENTION

The present invention provides a stabilized emitter follower circuit for use particularly with inductive appearing input sources, the circuit being convenient for integration. An emitter follower circuit is provided. A series circuit of a resistor and a capacitor is effectively connected in parallel across the transistor base-emitter junction and the emitter follower load. The input impedance of the emitter follower circuit, with this added series circuit considered as part of the emitter follower input impedance, has a real part which is found to be positive as a function of frequency. The potential instability is thereby eliminated. Further, the added series circuit will not contribute to any steady direct current load on a driving source nor unduly slow circuit operation. One plate of the capacitor added for stabilization can be conveniently formed by use of a polysilicon deposition used in the construction of rapidly responsive transistors located elsewhere in the integrated device. The other plate is conveniently formed by the metallization deposition over a di-electric material as is used to form the device circuit interconnections in other portions of the integrated device.

DESCRIPTION OF THE PREFERRED EMBODIMENT

Figure 1:
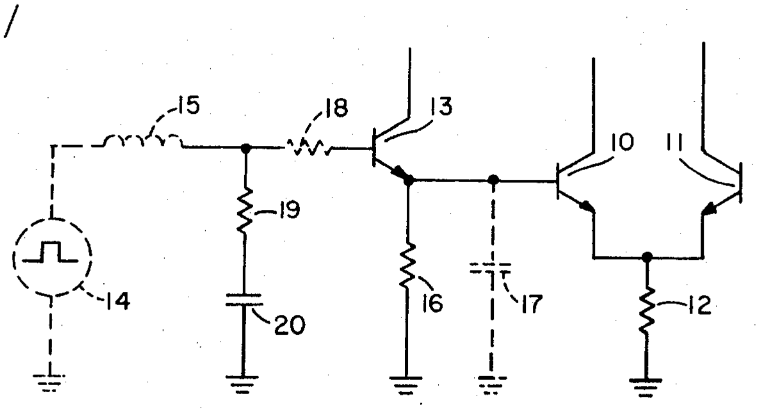
FIG. 1 is a schematic diagram of a circuit containing the present invention.

FIG. 1 shows the schematic of a portion of a digital logic circuit which would most commonly be constructed in a monolithic semiconductor integrated circuit chip though another construction technique might be used. Transistors 10 and 11 and resistor 12 are in the interior circuitry of the chip and are to receive switching signals from the emitter follower input circuit based on transistor 13. Voltage generator 14 and inductance 15 are not on the monolithic chip but represent a signal source and a source impedance presented to the monolithic chip from and through which the input signal to the monolithic chip is derived. The actual voltage source and source impedance may well be of a more complicated nature in an actual circuit. The transistor 13, operated as an emitter follower for an input circuit on the chip, has its primary load in series with its emitter through some load could appear in the collector circuit also. The primary load components here consist of resistor 16, the base of transistor 10 and the inherent capacitance, etc., always found associated with such load members in a monolithic chip and interconnections therebetween. These associated impedances are shown here merely as capacitor 17.

This capacitance 17 provides a negative real term at some frequencies in the input impedance of the emitter follower circuit when viewed from the base of transistor 13 thereby making the circuit potentially unstable. Therefore the connection of some kinds of source impedances will lead to oscillation. A source impedance which appears to be inductive such as the one indicated by inductance 15, is such a source impedance and so will lead to instability for some values of the effective inductance at some frequencies.

The base of a transistor inherently has some resistance which appears to be effectively in series with the base, shown here as dotted line base resistor 18, which directly tends to counter the negative real part of the input impedance of the emitter follower circuit. Increasing this effective series base resistance by adding external base resistance in series at the base, which can be considered as an addition to the dotted line resistance 18, will have the same effect. if such external base resistance is added in sufficient amount it will stabilize the emitter follower circuit. Such a method of stabilization is undersirable, however, since it will slow the speed of the transistor response to an input signal.

A circuit found to be much more compatible with designs utilizing rapidly responding transistors accepts the inherent series base resistance of the transistor 13. However, rather than adding further resistance in series at the base, the resistor 19 and the capacitor 20 in series with one another are together placed in parallel across the base-emitter junction of transistor 13 and the primary load in the emitter circuit of transistor 13. This stabilizing circuit of resistance 19 and capacitance 20 may be connected to a different potential value than is the primary load so long as the circuit is effectively in parallel across the primary load and the base emitter junction. For one monolithic device design, one with transistor 13 having around 200 ohms of effective input resistance in series with the base, resistance 19 was chosen to be about 1,000 ohms and capacitance 20 to be about 1 picofarad. With these component values the input impedance, viewed from the base of transistor 12 and taken to include the stabilizing circuitry has its real part remain positive over the entire frequency range. Since the stabilizing circuit is not in series with the base, no direct current load on the source 14 is added and no level shift or input current limiting results for a constant value input signal.

In designing transistors for monolithic device switching operations, say for digital logic applications, it is desired that a change in voltage levels at the base of the transistor lead to a change in voltage levels at the collector of the transistor as rapidly as possible, i.e., that the delay through the transistor be as small as possible. It has been found that when such transistors are constructed by use of a polysilicon deposition as a step in constructing the emitter that transistors with very short delay times result. This and other advantages have led to the use of polysilicon depositions as a step in constructing emitters and so the same polysilicon deposition step is available to simultaneously form other structures as well. It is then quite convenient to use the polysilicon deposition as one plate of capacitor 20 in FIG. 1.

Figure 2:
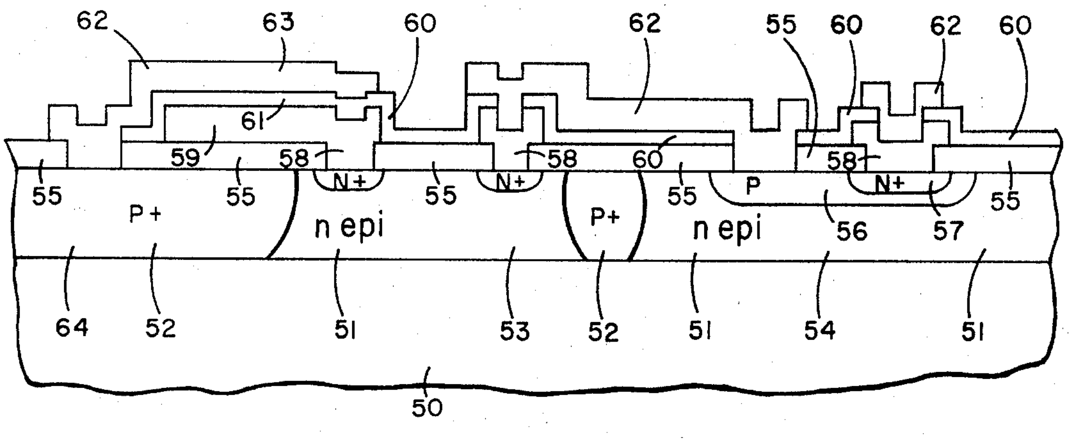
FIG. 2 is a sectional view representation of the construction of a monolithic integrated circuit device containing the present invention.

Referring now to FIG. 2, a monolithic device is shown with a *p* type silicon substrate 50 upon which an n type expitaxial layer 51 has been grown. A *p*+ diffusion 52 has been made to isolate portions of the epitaxial layer 53 and 54. This epitaxial layer 51 as separated by the *p*+ diffusion 52 is shown covered by a silicon dioxide layer 55 with the exception of certain access openings.

An input transistor, corresponding to transistor 13 of FIG. 1, is shown constructed in the isolated expitaxial portion 54 where the portion 54 itself serves as the collector of the transistor. A *p* diffusion forms the transistor base 56 and an n+ diffusion forms the transistor emitter 57.

The other isolated epitaxial portion shown, 53, serves as a resistor. This corresponds to resistor 19 of FIG. 1.

A polysilicon deposition 58 is seen to make contact to all of the *n*+ type portions to be contacted through the silicon dioxide layer 55. This has been found to be an improved method of constructing transistors in monolithic devices where a small emitter is required for the design of a transistor capable of handling rapid pulse signals.

The polysilicon deposition provided for contacting an end of the resistor formed in isolated epitaxial region 53 is easily and conveniently extended to form capacitor plate 59 which corresponds to a plate of the capacitor 20 of FIG. 1. This extension requires no special processing step beyond the deposition for contacts to *n*+ type portions and is made simultaneously with such contacts.

It has been found that a phosphorus doped silicon dioxide deposition and its remelt over surfaces which are to support metal for interconnection purposes is a desirable process step prior to metallization. This is to remove sharp steps upon which overlaying metallization paths tends to part causing circuit opens. Phosphorus doped silicon dioxide deposition 60 is shown for this purpose. Such a deposition is easily and conveniently extended to form capacitor dielectric 61 over the polysilicon capacitor plate 59. The capacitor dielectric for capacitor 20 of FIG. 1 thus requires no special process step but is formed simultaneously with a surface preparation step for metallization.

metallization deposition interconnection 62 is used to interconnect the various components constructed in the monolithic device. once again, an extension of the metallization deposition provides an easily and conveniently constructed capacitor plate 63 to form the remaining plate of capacitor 20 of FIG. 1 and in turn connect it to the *p* substrate 50 through a *p*+ diffusion 64.

It is therefore seen that capacitor 20 of FIG. 1 is constructed in a manner quite compatible with the construction of transistor 13 or transistors 10 and 11 of FIG. 1. It is of further convenience to use only the inherent resistance in the construction of the base 56 of FIG. 2 to provide base resistance 18 of FIG. 1 and not to provide another resistance in the monolithic device in series with the base.

The embodiments of the invention in which an exclusive property or right is claimed are defined as follows:

1. A stabilized emitter follower circuit capable of processing input signals containing high frequency components for intergrated circuits having an input terminal pad, said stabilized emitter follower circuit comprising:

an input transistor having a collector, a base and an emitter, said input transistor operated as an emitter follower having an effective primary load impedance provided between said emitter and a source connection means adapted for connection to a voltage source, and a stabilizing circuit consisting of a stabilizing resistance in series with a stabilizing capacitance, said stabilizing circuit effectively in parallel across said base, said emitter and said effective primary load impedance, there being a direct connection provided between said input terminal pad and said stabilizing circuit.

2. The circuit of claim 1 wherein a base resistance is provided in series with said base between said stabilizing circuit and said base.

3. The circuit of claim 1 wherein said stabilized emitter follower circuit is constructed as a monolithic integrated circuit device, said device having a semiconductor substrate with an epitaxial layer grown upon it.

4. The system of claim 3 wherein said stabilizing capacitance has a first and second plate means with a dielectric means therebetween and having said first plate means and dielectric means constructed outside said epitaxial layer.

5. The system of claim 4 wherein said second plate means is also constructed outside said epitaxial layer.

6. The system of claim 5 wherein said second plate means is formed of polysilicon.

7. The system of claim 6 wherein said dielectric means comprises a material otherwise provided for smoothing surfaces upon which a metallization deposition for interconnections is to be supported.

8. An input circuit for monolithic integrated circuit devices capable of processing input signals containing high frequency components, each of said devices having therein an input terminal pad and one or more internal components constructed of polysilicon at least in part, said input circuit comprising:

an input transistor having a collector, a base and an emitter, said input transistor operated as an emitter follower having an effective primary load impedance provided between said emitter and a source connection means adapted for connection to a voltage source, and a series circuit effectively in parallel across said base, said emitter and said effective primary load impedance, there being a direct connection provided between said input terminal pad and said series circuit, said series circuit containing:

a stabilizing capacitance having a first plate means thereof constructed of said polysilicon, and a stabilizing resistance in series with said stabilizing capacitance.

9. The system of claim 8 wherein said stabilizing capacitance has dielectric means which comprises a material otherwise provided for smoothing surfaces upon which a metallization deposition for interconnections is to be supported.

10. The system of claim 9 wherein said stabilizing capacitance has a second plate constructed of a metal.

11. The system of claim 10 wherein said input transistor is constructed by use of said polysilicon to form a contact to said emitter.

12. The system of claim 8 wherein an increased base resistance is provided effectively in series with said base.

* * * * *